US009090993B2

(12) United States Patent
Miyoshi et al.

(10) Patent No.: US 9,090,993 B2
(45) Date of Patent: Jul. 28, 2015

(54) EPITAXIAL SUBSTRATE COMPRISING A SUPERLATTICE GROUP AND METHOD FOR MANUFACTURING THE EPITAXIAL SUBSTRATE

(75) Inventors: Makoto Miyoshi, Inazawa (JP); Shigeaki Sumiya, Handa (JP); Mikiya Ichimura, Ichinomiya (JP); Tomohiko Sugiyama, Nagoya (JP); Mitsuhiro Tanaka, Tsukuba (JP)

(73) Assignee: NGK Insulators, Ltd., Nagoya (JP)

( * ) Notice: Subject to any disclaimer, the term of this patent is extended or adjusted under 35 U.S.C. 154(b) by 101 days.

(21) Appl. No.: 13/570,665

(22) Filed: Aug. 9, 2012

(65) Prior Publication Data
US 2013/0032781 A1 Feb. 7, 2013

Related U.S. Application Data

(63) Continuation of application No. PCT/JP2010/071581, filed on Dec. 2, 2010.

(30) Foreign Application Priority Data

Feb. 16, 2010 (JP) .................. 2010-031267

(51) Int. Cl.
*H01L 21/02* (2006.01)
*C30B 29/40* (2006.01)
(Continued)

(52) U.S. Cl.
CPC .............. *C30B 29/403* (2013.01); *C30B 25/18* (2013.01); *C30B 25/183* (2013.01); *C30B 29/68* (2013.01);
(Continued)

(58) Field of Classification Search
CPC .... C30B 25/183; C30B 29/403; C30B 29/68; H01L 21/02458; H01L 21/02507; H01L 21/0254; H01L 29/15; H01L 29/155
USPC ........................ 257/190, E33.003, E33.005
See application file for complete search history.

(56) References Cited

U.S. PATENT DOCUMENTS 6,255,004 B1 7/2001 Yoshida
6,890,791 B2 5/2005 Ohtsuka et al.
(Continued)

FOREIGN PATENT DOCUMENTS

JP 10-163528 A1 6/1998
JP 2003-059948 A1 2/2003
(Continued)

OTHER PUBLICATIONS

International Preliminary Report on Patentability (with English Translation), Application No. PCT/JP20I0/071581, dated Aug. 21, 2012 (14 pages).
(Continued)

*Primary Examiner* — Jay C Kim
(74) *Attorney, Agent, or Firm* — Burr & Brown, PLLC

(57) ABSTRACT

Provided is a crack-free epitaxial substrate with reduced warping, in which a silicon substrate is used as a base substrate. The epitaxial substrate includes a (111) single crystal Si substrate, a superlattice layer group in which a plurality of superlattice layers are laminated, and a crystal layer. The superlattice layer is formed of a first unit layer and a second unit layer made of group-III nitrides having different compositions being alternately and repeatedly laminated. The crystal layer is made of a group-III nitride and formed above the base substrate so as to be positioned at an upper side of the superlattice layer group relative to the base substrate. The superlattice layer group has a compressive strain contained therein. In the superlattice layer group, the more distant the superlattice layer is from the base substrate, the greater the compressive strain becomes.

6 Claims, 5 Drawing Sheets

(51) Int. Cl.

| | | |
|---|---|---|
| *C30B 25/18* | (2006.01) | |
| *H01L 29/15* | (2006.01) | |
| *C30B 29/68* | (2006.01) | |
| *H01L 33/00* | (2010.01) | |
| *H01L 33/04* | (2010.01) | |
| *H01L 33/12* | (2010.01) | |
| *H01L 29/778* | (2006.01) | |
| *H01L 29/872* | (2006.01) | |

(52) U.S. Cl.
CPC ...... *H01L 21/0254* (2013.01); *H01L 21/02381* (2013.01); *H01L 21/02458* (2013.01); *H01L 21/02507* (2013.01); *H01L 29/155* (2013.01); *H01L 29/7786* (2013.01); *H01L 29/872* (2013.01); *H01L 33/007* (2013.01); *H01L 33/04* (2013.01); *H01L 33/12* (2013.01)

(56) References Cited

U.S. PATENT DOCUMENTS

| | | | |
|---|---|---|---|
| 7,652,282 B2 * | 1/2010 | Yanagihara | 257/19 |
| 8,227,790 B2 * | 7/2012 | Kikuchi et al. | 257/13 |
| 2006/0191474 A1 | 8/2006 | Chen et al. | |
| 2007/0128743 A1 * | 6/2007 | Huang et al. | 438/21 |
| 2008/0179605 A1 * | 7/2008 | Takase et al. | 257/94 |
| 2008/0203382 A1 | 8/2008 | Yanagihara | |
| 2009/0200645 A1 | 8/2009 | Kokawa et al. | |
| 2010/0213577 A1 | 8/2010 | Kato et al. | |

FOREIGN PATENT DOCUMENTS

| | | |
|---|---|---|
| JP | 2004-349387 A1 | 12/2004 |
| JP | 2005-350321 A1 | 12/2005 |
| JP | 2007-221001 A1 | 8/2007 |
| JP | 2008-205117 A1 | 9/2008 |
| JP | 2009-188252 A1 | 8/2009 |
| JP | 2009-289956 A1 | 12/2009 |
| JP | 2010-199441 A1 | 9/2010 |
| WO | WO 2009/050955 A1 * | 4/2009 ............. H01L 33/00 |

OTHER PUBLICATIONS

Toshihide Kikkawa, et. al., "*Highly Reliable 250W GaN High Electron Mobility Transistor Power Amplifier,*" Japan Journal of Applied Physics, vol. 44, No. 7A, 2005, pp. 4896-4901.

Nariaki Ikeda, et al., "*High Power AlGaN/GaN HFET with a High Breakdown Voltage of Over 1.8kV on 4 inch Si Substrates and the Suppression of Current Collapse,*" Proceedings of the 20th International Symposium on Power Semiconductor Devices & IC's, May 18-22, 2008, p. 287.

International Search Report dated Jan. 18, 2011 (with English translation).

Extended European Search Report (Application No. 10846175.7) dated Jan. 24, 2014.

* cited by examiner

FIG. 5

| | FIRST SUPERLATTICE LAYER | | SECOND SUPERLATTICE LAYER | | THIRD SUPERLATTICE LAYER | | COMPOSITION OF INTERMEDIATE LAYER | TOTAL FILM THICKNESS (μm) | AMOUNT OF WARPING (μm) | PRESENCE OR ABSENCE OF CRACKING |
|---|---|---|---|---|---|---|---|---|---|---|
| THICKNESS (nm) | FIRST UNIT LAYER | SECOND UNIT LAYER | FIRST UNIT LAYER | SECOND UNIT LAYER | FIRST UNIT LAYER | SECOND UNIT LAYER | | | | |
| | 5 | 15 | 10 | 45 | 10 | 90 | | | | |
| THE NUMBER OF REPETITIONS OF PAIR LAYER | | | | | | | | | | |
| EXAMPLE 1 | 20 | | 15 | | 10 | | GaN | 3.2 | 55.4 | NOT OBSERVED |
| EXAMPLE 2 | 20 | | 15 | | 10 | | Al$_{0.208}$Ga$_{0.792}$N | 3.2 | 53.4 | NOT OBSERVED |
| EXAMPLE 3 | 20 | | 15 | | 10 | | Al$_{0.1}$Ga$_{0.9}$N | 3.2 | 63.4 | NOT OBSERVED |
| EXAMPLE 4 | 20 | | 30 | | NOT FORMED | | GaN | 3.1 | 68.4 | NOT OBSERVED |
| EXAMPLE 5 | 20 | | 6 | 12 | | | Al$_{0.1}$Ga$_{0.9}$N | 3.0 | 69.8 | NOT OBSERVED |
| COMPARATIVE EXAMPLE | 100 | | NOT FORMED | | | | GaN | 3.0 | 126 | OBSERVED |

EPITAXIAL SUBSTRATE COMPRISING A SUPERLATTICE GROUP AND METHOD FOR MANUFACTURING THE EPITAXIAL SUBSTRATE

BACKGROUND OF THE INVENTION

1. Technical Field

The present invention relates to an epitaxial substrate for use in a semiconductor device, and particularly to an epitaxial substrate made of a group-III nitride.

2. Description of Related Art

A nitride semiconductor is attracting attention as a semiconductor material for a light-emitting device such as a LED or a LD and for a high-frequency/high-power electronic device such as a HEMT, because the nitride semiconductor has a wide band gap of direct transition type and the breakdown electric field and the saturation electron velocity thereat are high. For example, a HEMT (high electron mobility transistor) device in which a barrier layer made of AlGaN and a channel layer made of GaN are laminated takes advantage of the feature that causes a high-concentration two-dimensional electron gas (2DEG) to occur in a lamination interface (hetero interface) due to the large polarization effect (a spontaneous polarization effect and a piezo polarization effect) specific to a nitride material (for example, see Non-Patent Document 1).

In some cases, a single crystal (a different kind single crystal) having a composition different from that of a group-III nitride, such as SiC, is used as a base substrate for use in a HEMT-device epitaxial substrate. In this case, a buffer layer such as a strained-superlattice layer or a low-temperature growth buffer layer is generally formed as an initially-grown layer on the base substrate. Accordingly, as configuration in which a barrier layer, a channel layer, and a buffer layer are epitaxially formed on a base substrate is the most basic configuration of the HEMT-device substrate including a base substrate made of a different kind single crystal. Additionally, a spacer layer having a thickness of about 1 nm may be sometimes provided between the barrier layer and the channel layer, for the purpose of facilitating a spatial confinement of the two-dimensional electron gas. The spacer layer is made of for example, AlN. Moreover, a cap layer made of, for example, an n-type GaN layer or a superlattice layer may be sometimes formed on the barrier layer, for the purpose of controlling the energy level at the most superficial surface of the HEMT-device substrate and improving contact characteristics of contact with an electrode.

The HEMT device and the HEMT-device substrate involve various problems including problems concerning improvement of the performance such as increasing the power density and efficiency, problems concerning improvement of the functionality such as a normally-off operation, fundamental problems concerning a high reliability and cost reduction, and the like. Active efforts are made on each of the problems.

On the other hand, in the preparation of the above-mentioned nitride device, research and development have been made about the use of single crystal silicon for a base substrate for the purpose of reduction of the cost of an epitaxial substrate, furthermore, integration with a silicon-based circuit device, and the like (for example, see Patent Documents 1 to 3, and Non-Patent Document 2). In a case where a conductive material such as silicon is selected as the base substrate of the HEMT-device epitaxial substrate, a field plate effect is applied from a back surface of the base substrate, and therefore a HEMT device can be designed for a high breakdown voltage and high-speed switching.

It is already known that, in order that the HEMT-device epitaxial substrate can be structured with a high breakdown voltage, it is effective to increase the total film thickness of the channel layer and the barrier layer and to improve the electrical breakdown strength of both of the layers for example, see Non-Patent Document 2).

A method for manufacturing a semiconductor device is also known in which an interposed layer made of AlN is formed on a Si base substrate, then a first semiconductor layer made of GaN and a second semiconductor layer made of AlN are alternately formed so as to cause convex warning as a whole, and then these layers are made contract at a subsequent temperature drop, to result in cancellation of the warping of the entire substrate (for example, see Patent Document 4).

However, it is known that forming a nitride film of good quality on a silicon substrate is very difficult as compared with a case of using a sapphire substrate or a SiC substrate, for the following reasons.

Firstly, the values of the lattice constants of silicon and a nitride material are greatly different from each other. This causes a misfit dislocation at an interface between the silicon substrate and a growth film, and facilitates a three-dimensional growth mode at a timing from the nucleus formation to the growth. In other words, this is a factor that hinders the formation of a good nitride epitaxial film having a low dislocation density and a flat surface.

Additionally, the nitride material has a higher thermal expansion coefficient value than that of silicon. Therefore, in the step of lowering the temperature to the vicinity of the room temperature after a nitride film is epitaxially grown on the silicon substrate at a high temperature a tensile stress acts in the nitride film. As a result, it is likely that cracking occurs in a film surface and large warping occurs in the substrate.

Moreover, it is also known that trimethylgallium (TMG) that is a material gas of the nitride material for a vapor-phase growth is likely to form a liquid-phase compound with silicon, which is a factor that hinders the epitaxial growth.

In a case where the conventional techniques disclosed in the Patent Documents 1 to 3 and in the Non-Patent Document 1 are adopted, it is possible to cause an epitaxial growth of a GaN film on the silicon substrate. However, the resulting GaN film never has a better crystal quality as compared with a case of using SiC or sapphire for the base substrate. Therefore, preparing an electronic device such as a HEMT using the conventional techniques involves problems of a low electron mobility, a leakage current during the off-time, and a low breakdown voltage.

Furthermore, in the method disclosed in the Patent Document 4, large convex warping is intentionally caused in the course of the device preparation. This may cause cracking in the course of the device preparation, depending on conditions under which the layers are formed.

PRIOR-ART DOCUMENTS

Patent Documents

Patent Document 1: Japanese Patent Application laid-Open No. 10-163528 (1998)
Patent Document 2: Japanese Patent Application Laid-Open No. 2004-349387
Patent Document 3: Japanese Patent Application Laid-Open No. 2005-350321

Patent Document 4: Japanese Patent Application Laid-Open No. 2009-289956

Non-Patent Documents

Non-Patent Document 1: "Highly Reliable 250W GaN High Electron Mobility Transistor Power Amplifier", Toshihide Kikkawa, Jpn. J. Appl. Phys. 44, (2005), 4896.

Non-Patent Document 2: "High power AlGaN/GaN HFET with a high breakdown voltage of over 1.8 kV on 4inch Si substrates and the suppression of current collapse", Nariaki Ikeda, Syuusuke Kaya, Jiang Li, Yoshihiro Sato, Sadahiro Kato, Seikoh Yoshida, Proceedings of the 20th International Symposium on Power Semiconductor Devices & IC's May 18-22, 2008 Orlando, FL, pp.287-290

SUMMARY OF THE INVENTION

The present invention has been made in view of the problems described above, and an object of the present invention is to provide a crack-free epitaxial substrate with reduced warping in which a silicon substrate is used as a base substrate.

To solve the problems described above, as first aspect of the present invention is an epitaxial substrate in which a group of group-III nitride layers are formed on a base substrate made of (111)-oriented single crystal silicon such that a (0001) crystal plane of the group of group-III nitride layers is substantially in parallel with a substrate surface of the base substrate. The epitaxial substrate includes: a superlattice layer group in which a plurality of superlattice layers are laminated, the superlattice layer being formed of a first unit layer and a second unit layer made of group-III nitrides having different compositions being alternately and repeatedly laminated; and a crystal layer made of a group-III nitride and formed above the base substrate, the crystal layer being positioned at an upper side of the superlattice layer group relative to the base substrate. The superlattice layer group has a compressive strain contained therein, and, in the superlattice layer group, the more distant the superlattice layer is from the base substrate, the greater the compressive strain becomes.

In a second aspect of the present invention, in the epitaxial substrate according to the first aspect, a second group-III nitride of the second unit layer has an in-plane lattice constant, under a strain-free state, greater than that of a first group-III nitride of the first unit layer; each of the second unit layers is formed so as to be in a coherent state relative to the first unit layer located immediately below; and in the superlattice layer group, the superlattice layer formed at an upper position has an increased thickness of the second unit layer.

In a third aspect of the present invention, the epitaxial substrate according to the first aspect further includes an intermediate layer formed immediately on the superlattice layer group, the intermediate layer enhancing the compressive strain introduced in the epitaxial substrate by the superlattice layer group.

In a fourth aspect of the present invention, in the epitaxial substrate according to the third aspect, the intermediate layer is made of a group-III nitride, and formed so as to be in a coherent state relative to the superlattice layer group.

A fifth aspect of the present invention is an epitaxial substrate in which a group of group-III nitride layers are formed on a base substrate made of (111)-oriented single crystal silicon such that a (0001) crystal plane of the group of group-III nitride layers is substantially in parallel with a substrate surface of the base substrate. The epitaxial substrate includes: a superlattice layer group in which a plurality of superlattice layers are laminated, the superlattice layer being formed of a first unit layer and a second unit layer made of group-III nitrides having different compositions being alternately and repeatedly laminated; and a crystal layer made of a group-III nitride and formed above the superlattice layer group. A second group-III nitride of the second unit layer has an in-plane lattice constant, under a strain-free state, greater than that of a first group-III nitride of the first unit layer. Each of the second unit layers is formed so as to be in a coherent state relative to the first unit layer located immediately below. In the superlattice layer group, the superlattice layer formed at an upper position has an increased thickness of the second unit layer.

In a sixth aspect of the present invention, the epitaxial substrate according to the fifth aspect further includes an intermediate layer made of a group-III nitride and formed immediately on the superlattice layer group, the intermediate layer being formed so as to be in a coherent state relative to the superlattice layer group.

In a seventh aspect of the present invention, in the epitaxial substrate according to the first or fifth aspect, the first unit layer is made of AlN, and the second unit layer is made of a group-III nitride having a composition of $Al_xGa_{1-x}N$ ($0 \leq x \leq 0.25$).

In an eighth aspect of the present invention, in the epitaxial substrate according to the seventh aspect, the first intermediate layer is made of a group-III nitride having a composition of $Al_yGa_{1-y}N$ ($0 \leq y \leq 0.25$) and formed with a thickness of 50 nm or more and 250 nm or less.

In a ninth aspect of the present invention, the epitaxial substrate according to the first or fifth aspect further includes: a first base layer made of AlN and formed on the base substrate; and a second base layer made of $Al_pGa_{1-p}N$ ($0 \leq p < 1$) and formed on the first base layer. The first base layer is a layer with many crystal defects configured of at least one kind from a columnar or granular crystal or domain. An interface between the first base layer and the second base layer defines a three-dimensional concavo-convex surface. The superlattice layer group is formed immediately on the second base layer.

A tenth aspect of the present invention is a method for manufacturing an epitaxial substrate for use in as semiconductor device, the epitaxial substrate having a group of group-III nitride layers formed on a base substrate made of (111)-oriented single crystal silicon such that a (0001) crystal plane of the group of group-III nitride layers is substantially in parallel with a substrate surface of the base substrate. The method includes: a superlattice layer group formation step for repeating superlattice layer formation step a plurality of times to thereby form a superlattice layer group in which a plurality of superlattice layers are laminated, the superlattice layer formation step being a step for forming a superlattice layer by alternately and repeatedly laminating a first unit layer and a second unit layer made of group-III nitrides having different compositions; and a crystal layer formation step for forming a crystal layer made of a group-III nitride at a position above the superlattice layer group. In the superlattice layer group formation step, the first unit layer and the second unit layer are formed in such a manner that a second group-III nitride of the second unit layer has an in-plane lattice constant, under a strain-free state, greater than that of a first group-III nitride of the first unit layer; each of the second unit layers is in a coherent state relative to the first unit layer located immediately below; and the superlattice layer formed at an upper position has an increased thickness of the second unit layer.

In an eleventh aspect of the present invention, the method for manufacturing the epitaxial substrate according to the tenth aspect further includes an intermediate layer formation step for forming an intermediate layer so as to be in a coherent state relative to the superlattice layer group, the intermediate layer being made of a group-III nitride and formed immediately on the superlattice layer group.

In a twelfth aspect of the present invention, in the method for manufacturing the epitaxial substrate according to the tenth aspect, the first unit layer is made of AlN and the second unit layer is made of a group-III nitride having a composition of $Al_xGa_{1-x}N$ ($0 \le x \le 0.25$).

In a thirteenth aspect of the present invention, in the method for manufacturing the epitaxial substrate according to the twelfth aspect, the first intermediate layer is made of a group-III nitride having a composition of $Al_yGa_{1-y}N$ ($0 \le y \le 0.25$) and formed with a thickness of 50 nm or more and 250 nm or less.

In a fourteenth aspect of the present invention, the method for manufacturing the epitaxial substrate according to the tenth aspect further includes: a first base layer formation step for forming a first base layer on the base substrate, the first base layer being made of AlN; and a second base layer formation step for forming a second base layer on the first base layer, the second base layer being made of $Al_pGa_{1-p}N$ ($0 \le p < 1$). In the first base layer formation step, the first base layer is formed as a layer with many crystal defects configured of at least one kind from a columnar or granular crystal or domain, such that a surface thereof is a three-dimensional concavo-convex surface. In the superlattice layer group formation step, the superlattice layer group is formed immediately on the second base layer.

In the first to fourteenth aspects of the present invention, the compressive strain exists in the superlattice layer group. Accordingly, a tensile stress caused by a difference in a thermal expansion coefficient between silicon and a group-III nitride is cancelled by the compressive strain. Therefore, a crack-free epitaxial substrate having a small amount of warping and an excellent crystal quality can be obtained even when a silicon substrate is used as the base substrate.

Particularly in the third, fourth, and sixth aspects, the compressive strain introduced by the superlattice layer group is enhanced, and therefore a tensile stress is more suitably cancelled. Accordingly, in the epitaxial substrate, warping is more effectively reduced, and additionally a crack-free state is more surely achieved.

Particularly, in the ninth and fourteenth aspects, the superlattice layer group is provided on the base layer having a low dislocation and an excellent surface flatness. Accordingly, the superlattice layer group, the crystal layer, and the like, have good crystal quality. On the other hand, an accumulation of strain energy in the second base layer is suppressed. Therefore, the effect of canceling the tensile stress exerted by the compressive strain existing in the superlattice layer group is not hindered by any accumulation of strain energy in the base layer.

BRIEF DESCRIPTION OF THE DRAWINGS

FIG. 5 is a diagram showing a list of a specific preparation condition, a total film thickness, the amount of warping, and the presence or absence of occurrence of cracking, for each of epitaxial substrates according to examples and the comparative example.

DETAILED DESCRIPTION OF THE INVENTION

<Outline Configuration of Epitaxial Substrate>

Figure 1:
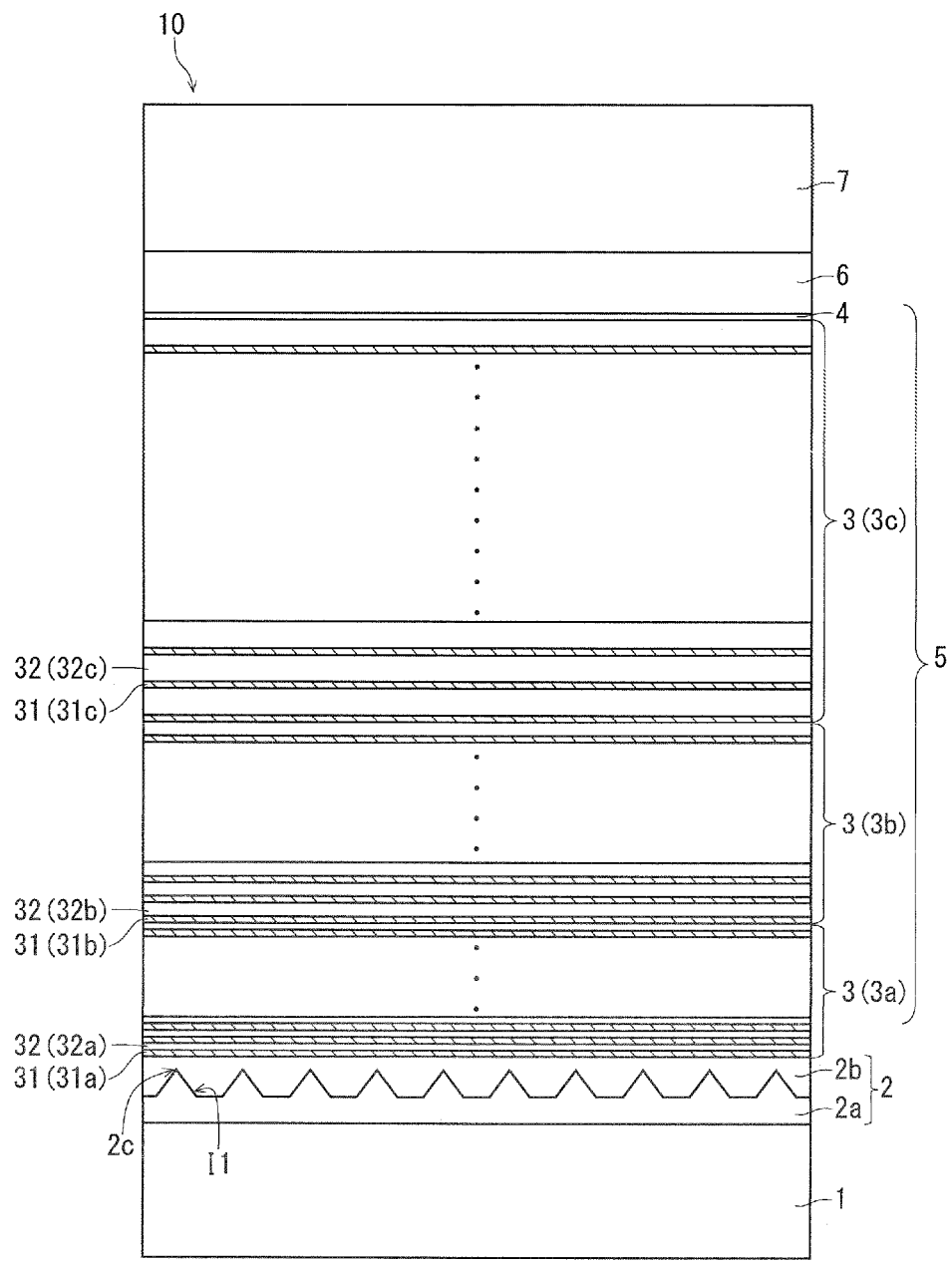
FIG. 1 is a schematic cross-sectional view showing an outline configuration of an epitaxial substrate according to an embodiment of the present invention.

FIG. 1 is a schematic cross-sectional view showing an outline configuration of an epitaxial substrate 10 according to an embodiment of the present invention.

The epitaxial substrate 10 mainly includes a base substrate 1, a base layer 2, a superlattice layer group 5 in which a plurality of superlattice layers 3 and a termination layer 4 are laminated, an intermediate layer 6, and a function layer 7. In the following, the layers formed on the base substrate 1 will be sometimes collectively referred to as an epitaxial film.

The base substrate 1 is a wafer of (111) plane single crystal silicon having p-type conductivity. The thickness of the base substrate 1 is not particularly limited, but for convenience of handling, it is preferable to use the base substrate 1 having a thickness of several hundred μm to several mm.

Each of the base layer 2, the respective superlattice layers 3, the termination layer 4, the intermediate layer 6, and the function layer 7 is a layer formed of a wurtzite-type group-III nitride by using an epitaxial growth method such that a its (0001) crystal plane can be substantially in parallel with a substrate surface of the base substrate 1. In a preferred example, these layers are formed by a metalorganic chemical vapor deposition method (MOCVD method).

The base layer 2 is a layer provided for the purpose of enabling each of the above-mentioned layers to be formed thereon with a good crystal quality. To be specific, the base layer 2 is formed in such a manner that its dislocation density is suitably reduced and it has a good crystal quality at least near a surface thereof (near an interface with the superlattice layer 3). As a result, a good crystal quality is obtained in the superlattice layer 3, and additionally in the layers formed thereon.

In this embodiment, to satisfy the purpose, the base layer 2 is composed of a first base layer 2a and a second base layer 2b, as described below.

The first base layer 2a is a layer made of AlN. The first base layer 2a is a layer configured of a large number of small columnar crystals or the like (at least one kind from columnar crystals, granular crystals, columnar domains, and granular domains) that have been grown in a direction (film formation direction) substantially perpendicular to the substrate surface of the base substrate 1. In other words, the first base layer 2a is a layer with many defects having inferior crystal properties, in which, although uniaxial orientation is achieved along a lamination direction of the epitaxial substrate 10, many crystal grain boundaries or dislocations exist along the lamination direction. In this embodiment, for convenience of the description, the crystal grain boundary is sometimes used as the term inclusive of domain grain boundaries and dislocations, too. In the first base layer 2a, the interval of the crystal grain boundaries is at most about several tens nm.

The first base layer 2a having this configuration is formed such that the half width of a (0002) X-ray rocking curve can be 0.5 degrees or more and 1.1 degrees or less and such that the half width of a (10-10) X-ray rocking curve can be 0.8 degrees or more and 1.1 degrees or less. The half width of the (0002) X-ray rocking curve serves as an index of the magnitude of mosaicity of a c-axis tilt component or the frequency of screw dislocations. The half width of the (10-10) X-ray rocking curve serves as an index of the magnitude of mosaicity of a crystal rotation component whose rotation axis is c-axis or the frequency of edge dislocations.

On the other hand, the second base layer 2b is a layer formed on the first base layer 2a and made of a group-III nitride having a composition of $Al_pGa_{1-p}N$ (0≤p<1).

An interface I1 (a surface of the first base layer 2a) between the first base layer 2a and the second base layer 2b is a three-dimensional concavo-convex surface that reflects the outer shapes of the columnar crystals and the like included in the first base layer 2a. The fact that the interface I1 has such a shape is clearly confirmed in, for example, a HAADF (high-angle annular dark-field) image of the epitaxial substrate 10. The HAADF image is obtained by a scanning transmission electron microscope (STEM), and is a mapping image of the integrated intensity of electron that is inelastically scattered at a high angle. In the HAADF image, the image intensity is proportional to the square of an atomic number, and a portion where an atom having a greater atomic number exists is observed more brightly (more white). Therefore, the second base layer 2b containing Ga is observed relatively bright, and the first base layer 2a not containing Ga is observed relatively dark. Thereby, the fact the interface 11 therebetween is a three-dimensional concavo-convex surface is easily recognized.

In the schematic cross-section of FIG. 1, convex portions 2c of the first base layer 2a are located at substantially regular intervals. This is merely for convenience of illustration. Actually, the convex portions 2c are not necessarily located at regular intervals. Preferably, the first base layer 2a is formed such that the density of the convex portions 2c can be $5 \times 10^9$/cm$^2$ or more and $5 \times 10^{10}$/cm$^2$ or less and the average interval of the convex portions 2c can be 45 nm or more and 140 nm or less. When these ranges are satisfied, the function layer 7 having, particularly, an excellent crystal quality can be formed. In this embodiment, the convex portion 2c of the first base layer 2a always denotes a position substantially at the apex of an upward convex portion of the surface (interface I1). From the results of experiments and observations made by the inventors of the present invention, it has been confirmed that a side wall of the convex portion 2c is formed by a (10-11) plane or (10-12) plane of AlN.

In order that the convex portions 2c that satisfy the above-mentioned density and average interval can be formed on the surface of the first base layer 2a, it is preferable to form the first base layer 2a with an average film thickness of 40 nm or more and 200 nm or less. In a case where the average film thickness is less than 40 nm, it is difficult to achieve a state where the substrate surface is thoroughly covered with AlN while forming the convex portions 2c as described above. On the other hand, when the average film thickness exceeds 200 nm, flattening of an AlN surface starts to progress, to make it difficult to form the convex portions 2c described above.

The formation of the first base layer 2a is performed under predetermined epitaxial growth conditions. Here, forming the first base layer 2a with AlN is preferable in terms of not containing Ga which forms a liquid-phase compound with silicon and in terms of easily configuring the interface I1 as a three-dimensional concavo-convex surface because a horizontal growth is relatively unlikely to progress.

In the epitaxial substrate 10, the first base layer 2a that is a layer with many defects in which the crystal grain boundaries exist is interposed between the base substrate 1 and the second base layer 2b in the above-described manner. This relieves a lattice misfit between the base substrate 1 and the second base layer 2b, and thus an accumulation of strain energy caused by this lattice misfit is suppressed. The above-described ranges of the half widths of the (0002) and (10-10) X-ray rocking curves with respect to the first base layer 2a are set as ranges that can suitably suppress the accumulation of strain energy by the crystal grain boundaries.

However, the interposition of the first base layer 2a causes an enormous number of dislocations originating from the crystal grain boundaries such as the columnar crystals of the first base layer 2a to propagate in the second base layer 2b. In this embodiment, as described above, the interface I1 between the first base layer 2a and the second base layer 2b is configured as a three-dimensional concavo-convex surface, and thereby the dislocations are effectively reduced.

Since the interface I1 between the first base layer 2a and the second base layer 2b is configured as a three-dimensional concavo-convex surface, most of the dislocations caused in the first base layer 2a are bent at the interface I1 during the propagation (penetration) from the first base layer 2a to the second base layer 2b, and coalesce and disappear within the second base layer 2b. As a result, only a small part of the dislocations originating from the first base layer 2a penetrates through the second base layer 2b.

Preferably, although the second base layer 2b is formed along the shape of the surface of the first base layer 2a (the shape of the interface I1) in an initial stage of the growth, the surface thereof is gradually flattened along with the progress of the growth, and finally obtains a surface roughness of 10 nm or less. In this embodiment, the surface roughness is expressed as an average roughness ra in a region of 5 μm×5 μm which has been measured by an AFM (atomic force microscope). Here, in terms of obtaining a good surface flatness of the second base layer 2b, it is preferable that the second base layer 2b is formed of a group-III nitride having a composition that contains at least Ga, which allows a horizontal growth to relatively easily progress.

It is preferable that the second base layer 2b has an average thickness of 40 nm or more. This is because, when the average thickness is less than 40 nm, such problems arise that concaves and convexes caused by the first base layer 2a cannot sufficiently be flattened, and that the disappearance of dislocations having propagated to the second base layer 2b and coalesced with each other does not sufficiently occur. In a case where the average thickness is 40 nm or more, the reduction of the dislocation density and the flattening of the surface are effectively caused. Therefore, in a technical sense, no particular limitation is put on an upper limit of the thickness of the second base layer 2b, but from the viewpoint of the productivity, it is preferable that the thickness is about several μm or less.

As described above, the surface of the second base layer 2b has a low dislocation and an excellent flatness, and therefore the layers formed thereon have a good crystal quality.

The superlattice layer group 5 is a part having a lamination of the plurality of superlattice layers 3, each of which is formed by a first unit layer 31 and a second unit layer 32, which are two kinds of group-III nitride layers having different compositions, being alternately and repeatedly laminated. Although FIG. 1 illustrates a case where three superlattice layers 3 (a first superlattice layer 3a, a second superlattice layer 3b, and a third superlattice layer 3c) are provided, a configuration of the superlattice layer group 5 is not limited thereto.

A pair of one first unit layer 31 and one second unit layer 32 is called a pair layer. In the epitaxial substrate 10 shown in FIG. 1, the first superlattice layer 3a is formed by a pair layer including a first unit layer 31a and a second unit layer 32a, the second superlattice layer 3b is formed by a pair layer including a first unit layer 31b and a second unit layer 32b, and the third superlattice layer 3c is formed by a pair layer including a first unit layer 31c and a second unit layer 32c.

In each of the superlattice layers 3, the first unit layer 31 and the second unit layer 32 are formed to satisfy such a relationship that an in-plane lattice constant (lattice length) under a strain-free state (bulk state) is greater in the group-III nitride of the latter than in the group-III nitride of the former.

In each of the superlattice layers 3, the second unit layer 32 is formed so as to be coherent to the first unit layer 31 located immediately below this second unit layer 32. Additionally, the thickness of the first unit layer 31 is less than the thickness of the second unit layer 32.

Moreover, the superlattice layer group 5 is configured such that the superlattice layer 3 located at an upper position (more distant from the base substrate 1) has an increased thickness of the second unit layer 32. For example, in a case of the epitaxial substrate 10 shown in FIG. 1, da≤db≤dc is established, where da represents the thickness of the second unit layer 32a of the first superlattice layer 3a, db represents the thickness of the second unit layer 32b of the second superlattice layer 3b, and dc represents the thickness of the second unit layer 32c of the third superlattice layer 3c. However, a specific thickness of the second unit layer 32 varies depending on for example, the number of superlattice layers 3 laminated n the superlattice layer group 5 or the position in the superlattice layer group 5 where the superlattice layer 3 is formed. As shown in FIG. 1, in a case where the superlattice layer group 5 includes three superlattice layers 3, it is preferable that the second unit layer 32 of the lowermost superlattice layer 3a has to thickness of about 10 nm to 20 nm. It is preferable that the second unit layer 32 of the uppermost superlattice layer 3c has a thickness of about several tens nm to 100 nm.

On the other hand, the first unit layer 31 is preferably formed with a thickness of about 3 to 20 nm. Typically, the first unit layer 31 is formed with a thickness of 5 to 10 nm. It is preferable that the number of repetitions of the pair layer is about five to several tens. Requirements concerning these parameters will be described later.

Preferably, the first unit layer 31 (31a, 31b, 31c) is made of AlN, and the second unit layer 32 (32a, 32b, 32c) is made of a group-III nitride having a composition of $Al_xGa_{1-x}N$ ($0 \leq x \leq 0.25$).

The termination layer 4 is a layer forming the uppermost layer of the superlattice layer group 5, and is a layer formed with the same composition and the same thickness as those of the first unit layer 31 of the uppermost superlattice layer 3. Thus, it can be considered that the termination layer 4 is, though not forming a pair layer, essentially a part of the uppermost superlattice layer 3.

The intermediate layer 6 is a layer made of a group-III nitride. For example, the intermediate layer 6 is made of a group-III nitride having a composition of $Al_yGa_{1-y}N$ ($0 \leq y \leq 0.25$). The intermediate layer 6 is formed so as to be coherent to the superlattice layer group 5 (more strictly to the termination layer 4). It is preferable that the intermediate layer 6 has a thickness of about 50 nm to 250 nm. However, the actual composition and thickness of the intermediate layer 6 are set in accordance with a manner of forming the superlattice layer group 5. Details of the intermediate layer 6 will be described later.

The function layer 7 is at least one layer made of a group-III nitride and formed on the intermediate layer 6. The function layer 7 is a layer that develops a predetermined function at the situation that predetermined semiconductor layers, electrodes, and the like, are additionally provided on the epitaxial substrate 10 to thereby form a semiconductor device. Accordingly, the function layer 7 is constituted of one or more layers having a composition and a thickness appropriate for this function. Although FIG. 1 illustrates a case where the function layer 7 is constituted of a single layer, the configuration of the function layer 7 is not limited thereto.

For example, a channel layer made of high-resistivity GaN and having a thickness of several μm and a barrier layer made of AlGaN, InAlN, or the like and having a thickness of several tens nm are laminated to serve as the function layer 7, and thereby the epitaxial substrate 10 for a HEMT device is obtained. That is, a HEMT device is obtained by forming a gate electrode, a source electrode, and a drain electrode on the barrier layer, though not shown. For forming these electrodes, a known technique such as a photolithography process is applicable. In such a case, a spacer layer made of AlN and having a thickness of about 1 nm may be provided between the channel layer and the barrier layer.

Alternatively, a concentric Schottky diode is achieved by forming one group-III nitride layer (for example, a GaN layer) as the function layer 7 and forming an anode and a cathode thereon, though not shown. For forming these electrodes, too, the known technique such as the photolithography process is applicable.

<Method for Manufacturing Epitaxial Substrate>

Next, a method for manufacturing the epitaxial substrate 10 will be generally described while a case of using the MOCVD method is taken as an example.

Firstly, a single crystal silicon wafer of a (111) plane is prepared as the base substrate 1. A natural oxide film is removed by dilute hydrofluoric acid cleaning. Then, SPM cleaning is performed to create a state where an oxide film having a thickness of several Å is formed on a wafer surface. This is set within a reactor of a MOCVD apparatus.

Then, each layer is formed under predetermined heating conditions and a predetermined gas atmosphere. Firstly, for the first base layer 2a made of AlN, a substrate temperature is maintained at a predetermined initial layer formation temperature of 800° C. or higher and 1200° C. or lower, and the pressure in the reactor is set to be about 0.1 to 30 kPa. In this state, a TMA (trimethylaluminum) bubbling gas that is an aluminum raw material and a $NH_3$ gas are introduced into the reactor with an appropriate molar flow ratio. A film formation speed is set to be 20 nm/min or higher, and a target film thickness is set to be 200 nm or less. Thereby, the formation of the first base layer 2a is achieved.

For the formation of the second base layer 2b, after the formation of the first base layer 2a, a substrate temperature is maintained at a predetermined second base layer formation temperature of 800° C. or higher and 1200° C. or lower, and the pressure in the reactor is set to be 0.1 to 100 kPa. In this state, a TMG (trimethylgallium) bubbling gas that is a gallium raw material, a TMA bubbling gas, and a $NH_3$ gas are introduced into the reactor with a predetermined flow ratio that is appropriate for a composition of the second base layer 2b to be prepared. Thus, $NH_3$ is reacted with TMA and TMG. Thereby, the formation of the second base layer 2b is achieved.

For the formation of the first unit layer 31 and the second unit layer 32 included in the superlattice layer 3, the termination layer 4, and the intermediate layer 6, subsequent to the formation of the second base layer 2b, a substrate temperature is maintained at a predetermined formation temperature of 800° C. or higher and 1200° C. or lower that is appropriate for each of the layers, and the pressure in the reactor is maintained at a predetermined value of 0.1 to 100 kPa that is appropriate for each of the layers. In this state, a $NH_3$ gas and a group-III nitride material gas (TMA and TMG bubbling gases) are introduced into the reactor with a flow ratio that is appropriate for a composition to be achieved in each of the layers. Thereby, the formation of the respective layers is achieved. At this time, by changing the flow ratio at a timing appropriate for a set film thickness, the respective layers are formed in a continuous manner and with desired film thicknesses.

For the formation of the function layer 7, after the formation of the intermediate layer 6, a substrate temperature is maintained at a predetermined function layer formation temperature of 800° C. or higher and 1200° C. or lower, and the pressure in the reactor is set to be 0.1 to 100 kPa. In this state, at least one of a TMI bubbling gas, a TMA bubbling gas, and a TMG bubbling gas, and a $NH_3$ gas are introduced into the reactor with a flow ratio that is appropriate for a composition of the function layer 7 to be prepared. Thus, $NH_3$ is reacted with at least one of TMI, TMA, and TMG. Thereby, the formation of the function layer 7 is achieved.

After the function layer 7 is formed, in the reactor, the temperature of the epitaxial substrate 10 is towered to an ordinary temperature. Then, the epitaxial substrate 10 is taken out from the reactor and subjected to an appropriate subsequent process (such as patterning of an electrode layer).

<Functions and Effects of Superlattice Layer Group>

Generally, as is the case for this embodiment as well, in a case of preparing an epitaxial substrate by causing a crystal layer made of a group-III nitride to epitaxially grow on a single crystal silicon wafer at a predetermined formation temperature, a tensile stress in an in-plane direction occurs in the crystal layer in the course of lowering the temperature to the ordinary temperature after the crystal growth, because the group-III nitride has a thermal expansion coefficient greater than that of silicon (for example, silicon: $3.4 \times 10^{-6}$/K, GaN: $5.5 \times 10^{-6}$/K). This tensile stress is a factor that causes warping in the epitaxial substrate and cracking in the crystal layer. In this embodiment, the superlattice layer group 5 is provided in the epitaxial substrate 10 for the purpose of reducing the tensile stress and suppressing the occurrence of warping and cracking mentioned above. In the following, a detailed description will be given to functions and effects thereof.

Figure 2A:
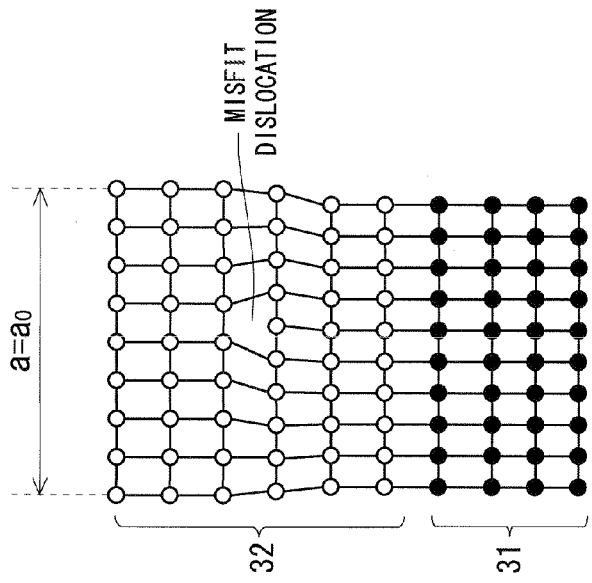
FIGS. 2A to 2C are model diagrams showing a crystal lattice at a time when a second unit layer is formed on a first unit layer.
Figure 2B:
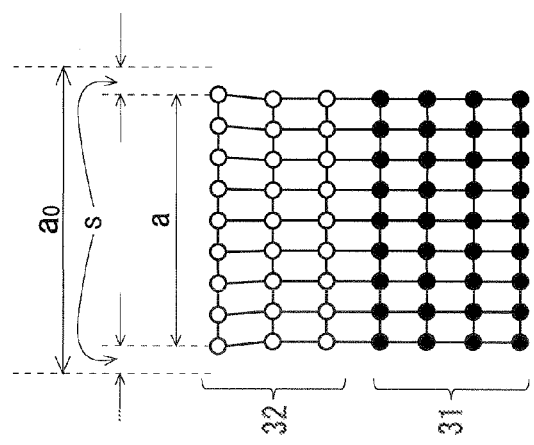
Figure 2C:
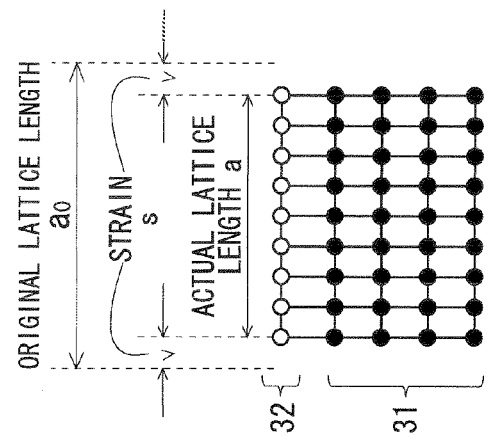

FIGS. 2A to 2C are model diagrams showing a crystal lattice at a time when the second unit layer 32 is formed on the first unit layer 31 in the superlattice layer 3. Here, the lattice length, in the in-plane direction, of the group-III nitride of the second unit layer 32 under the strain-free state is defined as $a_0$, and the actual lattice length thereof is defined as a. In this embodiment, as shown in FIGS. 2A and 2B, a crystal growth progresses in the second unit layer 32 while keeping aligned with the crystal lattice of the first unit layer 31. This means that a compressive strain of $s=a_0-a$ occurs in the in-plane direction of the second unit layer 32 during the crystal growth. That is, the crystal growth of the second unit layer 32 progresses with strain energy held therein.

As the growth advances, energy instability increases. Therefore, a misfit dislocation is gradually introduced in the second unit layer 32, for releasing the strain energy. Then, upon reaching a certain critical state, the strain energy held in the second unit layer 32 is fully released. At this time, a state of $s=a_0$ is provided as shown in FIG. 2C.

However, if the formation of the second unit layer 32 is terminated in a state of $a_0>a$ as shown in FIG. 2B prior to reaching the state shown in FIG. 2C, the second unit layer 32 remains holding the strain energy (remains containing the compressive strain). In this embodiment, such a crystal growth with the strain energy contained therein is referred to as a crystal growth in a coherent state. In other words, the second unit layer 32 is in the coherent state relative to the first unit layer 31 as long as the second unit layer 32 is formed with a thickness smaller than a critical film thickness at which the strain energy is fully released. Alternatively, in still other words, the second unit layer 32 is in the coherent state relative to the first unit layer 31 as long as the lattice length a of the uppermost surface of the second unit layer 32 (the surface that will be in contact with the first unit layer 31 located immediately above) satisfies $a_0>a$. Even if $a_0=a$ is provided in a part of the second unit layer 32, it can be said that the second unit layer 32 is in the coherent state relative to the first unit layer 31, as long as the second unit layer 32 contains the strain energy in the above-described manner.

The in-plane lattice constant of the group-III nitride of the first unit layer 31 is smaller than the in-plane lattice constant of the group-III nitride of the second unit layer 32. Therefore, even when the first unit layer 31 is formed on the second unit layer 32 with the strain energy held therein, the coherent state is maintained, not causing a release of the strain energy held in the second unit layer 32 located immediately below. Then, if the second unit layer 32 is again grown on this first unit layer 31 so as to make the coherent state, the same compressive strain as described above is also caused in this second unit layer 32, too.

Subsequently, in the same manner, the formation of the first unit layer 31 and the second unit layer 32 (the formation of the pair layer) is repeated while maintaining the growth in the coherent state. Thereby, the strain energy is held in the second unit layer 32 of each pair layer. Thus, the superlattice layer 3, as a whole, is formed as a part containing the compressive strain.

This compressive strain acts in a direction exactly opposite to the tensile stress that is caused by a difference in the thermal expansion coefficient, and therefore functions to cancel the tensile stress at the time of temperature drop. In outline, the tensile stress is cancelled by a force that is proportional to the product of the magnitude of the compressive strain in one pair layer and the number of repetitions of the pair layer in the superlattice layer 3.

In this embodiment, a plurality of the superlattice layers 3 in which the compressive strain is held as described above are laminated and thus the superlattice layer group 5 is formed. This causes a greater compressive strain than in a case where only one superlattice layer 3 is provided, so that the tensile stress occurring in the epitaxial substrate 10 is sufficiently reduced. As a result, in the epitaxial substrate 10, reduction of warping and achievement of a crack-free state are obtained.

That is, in this embodiment, the superlattice layer group 5 is a part that exhibits such a function and effect that the tensile stress occurring in the epitaxial substrate 10 is suitably cancelled by the compressive strain contained therein. In other words, in this embodiment, the superlattice layer group 5, as a whole, functions as a compressive strain containing layer.

Additionally, in this embodiment, the superlattice layer 3 located at an upper position has an increased thickness of the second unit layer 32. This is utilization of the fact that, in the upper superlattice layer 3 located above the superlattice layer 3 containing the compressive strain, a critical film thickness at which the strain energy is released during the formation of the second unit layer 32 is increased and therefore the second unit layer 32 can be grown thicker in the coherent state. Accordingly, in the superlattice layer group 5, the upper the superlattice layer 3 is located, the stronger the compressive strain contained therein is. The compressive strain obtained in this case is grater than the compressive strain obtained in a case where the identical pair layers are repeatedly laminated to form a single superlattice layer 3 having the same thickness as that of the superlattice layer group 5.

That is, in this embodiment, the superlattice layer group 5 is provided in such a manner that the thickness of the second unit layer 32 increases in the superlattice layer 3 located at an upper position. Thereby, the tensile stress is further cancelled, and consequently the warping is further suitably reduced and moreover occurrence of cracking is more surely prevented.

The first unit layer 31 is interposed between the two second unit layers 32. The first unit layer 31 having too small a thickness is not preferable, because this reduces the compressive strain occurring in the second unit layer 32, and rather, the tensile stress is likely to exist in the first unit layer 31 itself. On the other hand, too large a thickness is not preferable, either, because the second unit layer 32 itself is likely to receive a force in a tensile direction. The above-mentioned requirement that the thickness is about 3 to 20 nm is preferable in terms of not causing such failures.

The above-mentioned requirement that the first unit layer 31 is made of AlN and the second unit layer 32 is made of a group-III nitride having a composition of $Al_xGa_{1-x}N$ ($0 \leq x \leq 0.25$) is preferable in terms of providing a sufficient amount of compressive strain in each individual pair layer.

As described above, the superlattice layer group 5 is formed on the second base layer 2b in which an accumulation of strain energy is suppressed. Therefore, in this embodiment, a situation where strain energy is accumulated in the second base layer 2b and the effect of canceling the tensile stress is hindered due to the existence of such strain energy, does not occur.

Moreover, laminating the superlattice layers 3 to thereby provide the superlattice layer group 5 increases the total film thickness of the epitaxial film itself. In general, in a case where a HEMT device is prepared using the epitaxial substrate 10, as the total film thickness thereof increases, the breakdown voltage of the HEMT device becomes higher. Thus, the configuration of the epitaxial substrate 10 according to this embodiment also contributes to increase of the breakdown voltage.

<Functions and Effects of Intermediate Layer>

Figure 3:
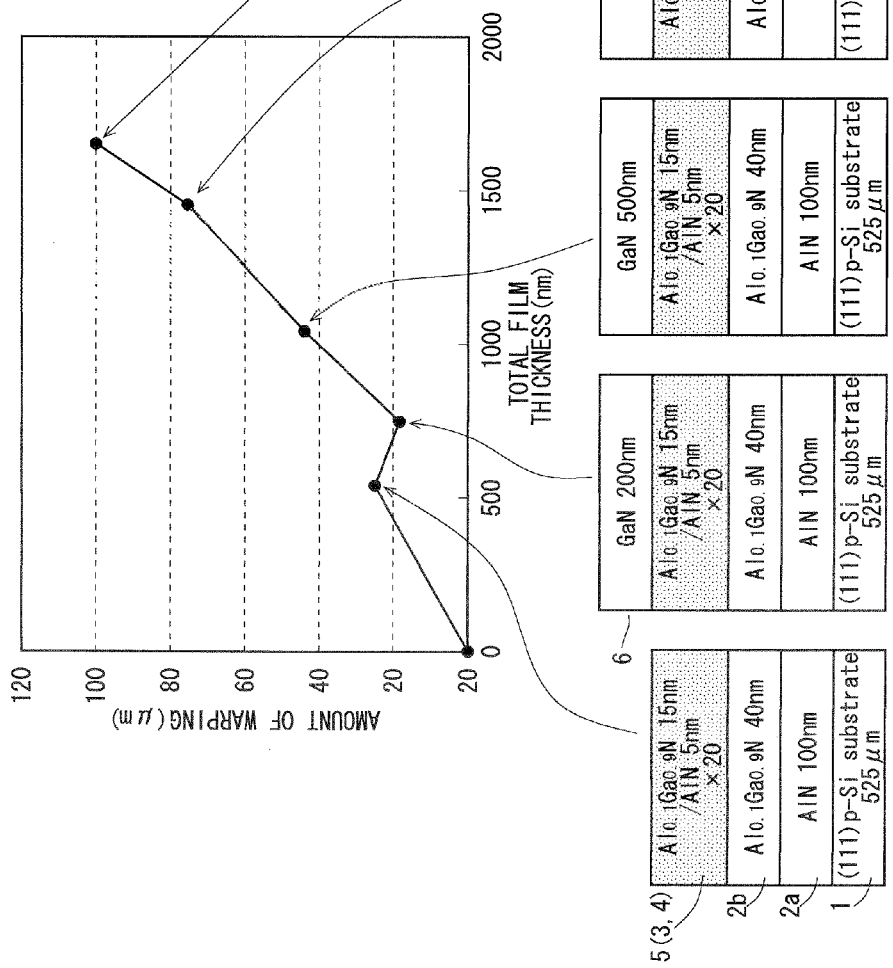
FIG. 3 is a diagram plotting, against the thickness of an intermediate layer, the amount of warping in an epitaxial substrate in which the steps up to the formation of the intermediate layer have been performed.

FIG. 3 is a diagram plotting, against the thickness of an intermediate layer 6, the amount of warping in an epitaxial substrate in which the steps up to the formation of the intermediate layer 6 have been performed. In this embodiment, the amount of warping in the epitaxial substrate is measured by a laser displacement gauge.

In five examples shown in FIG. 3, all the conditions are the same, except for the thickness of the intermediate layer 6. A (111) single crystal silicon wafer (with a thickness of 525 μm) having the p-type conductivity is adopted as the base substrate 1. Thereon, the first base layer 2a made of AlN with an average film thickness of 100 nm, the second base layer 2b made of $Al_{0.1}Ga_{0.9}N$ with an average film thickness of 40 nm, the superlattice layer group 5 including the superlattice layer 3 and the termination layer 4 not shown, and the intermediate layer 6 made of GaN are laminated. In the superlattice layer 3, the pair layer including the first unit layer 31 made of AlN with a thickness of 5 nm and the second unit layer 32 made of $Al_{0.1}Ga_{0.9}N$ with a thickness of 15 nm, are repeatedly laminated twenty times. Here, in FIG. 3, only one superlattice layer 3 is provided, while the plurality of superlattice layers 3 are laminated in the epitaxial substrate 10 according to this embodiment. However, in such a case, the same functions and effects of the intermediate layer 6 are obtained, too.

In FIG. 3, the amount of warping in the epitaxial substrate exhibits the local minimum when the thickness of the intermediate layer 6 is 200 nm. As described above, the intermediate layer 6 is formed in the coherent state relative to the termination layer 4. Accordingly, the result shown in FIG. 3 suggests that the intermediate layer 6 formed with a thickness of about 200 nm can function as to compressive strain reinforcing layer for enhancing the compressive strain having been introduced in the epitaxial substrate 10 by the superlattice layer group 5. In consideration of this result, in this embodiment, the intermediate layer 6 is formed with a thickness of about 50 nm to 250 nm. Consequently, in the epitaxial substrate 10 according to this embodiment, the tensile stress is further cancelled. Thus, further reduction of warping is achieved and occurrence of cracking is more surely prevented.

Here, when the thickness of the intermediate layer 6 becomes too large, the amount of warping in the epitaxial substrate 10 increases. This is because, as the crystal grows, an accumulation of the strain energy reaches a limit so that the compressive strain is weakened and it becomes difficult for the lattice to grow while kept in the coherent state, and eventually the critical film thickness is exceeded to consequently release the strain energy.

As described above, in this embodiment, the superlattice layer group formed by laminating the plurality of superlattice layers is interposed, as the compressive strain containing layer, between the base substrate and the function layer. Accordingly, a crack-free epitaxial substrate having a reduced amount of warping and an excellent crystal quality can be obtained in which a silicon substrate, which is easily available in a large diameter at a low cost, is adopted as a base substrate thereof.

<Modification>

In the epitaxial substrate 10, an interface layer (not shown) may be provided between the base substrate 1 and the first base layer 2a. In one preferable example, the interface layer has a thickness of about several nm and is made of amorphous $SiAl_uO_vN_w$.

In a case where an interface layer is provided between the base substrate 1 and the first base layer 2a, a lattice misfit between the base substrate 1 and the second base layer 2b, and the like, is more effectively relieved, and the crystal quality of each layer formed thereon is further improved. That is, in a case where an interface layer is provided, an AlN layer that is the first base layer 2a is formed such that the AlN layer can obtain a concavo-convex shape similar to a case where no interface layer is provided and such that the amount of crystal grain boundaries existing therein can be reduced as compared with the case where no interface layer is provided. Particularly, the first base layer 2a having improvement in the half width value of the (0002) X-ray rocking curve is obtained. This is because, in a case where the first base layer 2a is formed on the interface layer, nucleus formation of AlN, which will make the first base layer 2a, is less likely to progress than in a case where the first base layer 2a is formed directly on the base substrate 1, and consequently the growth in the horizontal direction is promoted as compared with when no interface layer is provided. The film thickness of the interface layer is to an extent not exceeding 5 nm. When such an interface layer is provided, the first base layer 2a can be formed such that the half width of the (0002) X-ray rocking curve can be in a range of 0.5 degrees or more and 0.8 degrees or less. In this case, the function layer 7 can be formed with a more excellent crystal quality in which the half width of the (0002) X-ray rocking curve is 800 sec or less and the screw dislocation density is $1 \times 10^9/cm^2$ or less.

The formation of the interface layer is achieved by, after the silicon wafer reaches the first base layer formation temperature and before the first base layer 2a is formed, introducing an only TMA bubbling gas into the reactor to expose the wafer to an TMA bubbling gas atmosphere.

Furthermore, in the formation of the first base layer 2a, at least one of Si atoms and O atoms may diffuse and form a solid solution in the first base layer 2a, or at least one of N atoms and O atoms may diffuse and form a solid solution in the base substrate 1.

EXAMPLES

Figure 4:
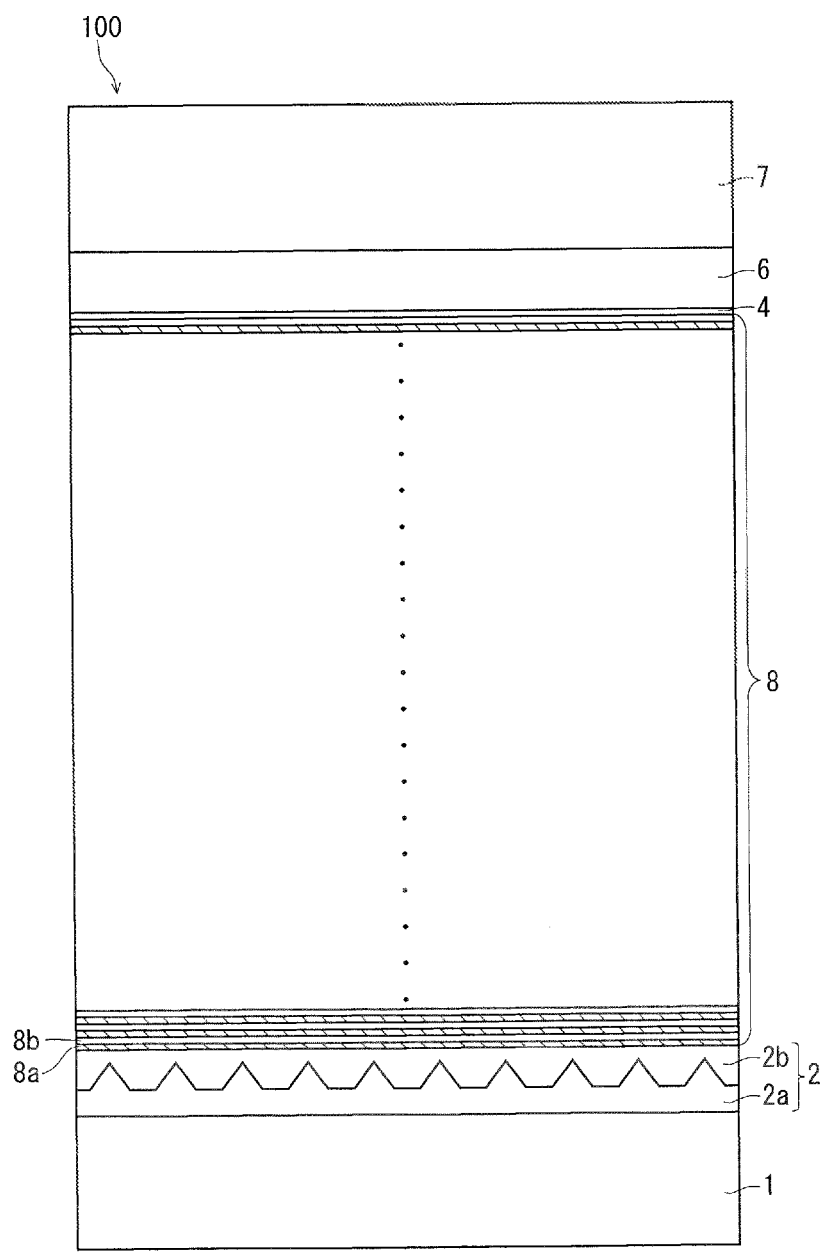
FIG. 4 is a schematic cross-sectional view showing an outline configuration of an epitaxial substrate according to a comparative example.

Epitaxial substrates 10 according to five examples (examples 1 to 5) different from one another in terms of the configuration of the superlattice layer group 5, and an epitaxial substrate 100 according to a comparative example including only a single superlattice layer instead of the superlattice layer group 5, were prepared. FIG. 4 is a schematic cross-sectional view showing an outline configuration of the epitaxial substrate 100. In the epitaxial substrate 100, a first unit layer 8a and a second unit layer 8b form a pair layer, and one superlattice layer 8 is formed. FIG. 5 is a diagram showing a list of a specific preparation condition, a total film thickness, the amount of warping, and the presence or absence of occurrence of cracking, for each of the epitaxial substrates according to the respective examples and the comparative example.

Until the formation of the second base layer 2b, the same procedure was performed in both the examples and the comparative examples. A (111) plane single crystal silicon wafer (hereinafter, a silicon wafer) of 4 inch having a p-type conductivity and having a substrate thickness of 525 μm was prepared as the base substrate 1. The prepared silicon wafer was subjected to dilute hydrofluoric acid cleaning using dilute hydrofluoric acid having a composition of hydrofluoric-acid/pure-water=1/10 (volume ratio), and to SPM cleaning using cleaning liquid having a composition of sulfuric-acid/aqueous-hydrogen-peroxide=1/1 (volume ratio). Thus, a state was created in which an oxide film having a thickness of several Å was formed on the wafer surface, which was then set in a reactor of a MOCVD apparatus. Then, a hydrogen/nitrogen mixed atmosphere was created in the reactor, and the pressure in the reactor was set to be 15 kPa. Heating was performed until the substrate temperature reached 1100° C. that is the first base layer formation temperature.

When the substrate temperature reached 1100° C., a $NH_3$ gas was introduced into the reactor, and the substrate surface was exposed to a $NH_3$ gas atmosphere for one minute.

Then, a TMA bubbling gas was introduced into the reactor with a predetermined flow ratio, to react $NH_3$ with TMA, so that the first base layer 2a whose surface has a three-dimensional concavo-convex shape was formed. At this time the growing speed (film formation speed) of the first base layer 2a was set to be 20 nm/min, and the target average film thickness of the first base layer 2a was set to be 100 nm.

After the first base layer 2a was formed, then the substrate temperature was set to be 1100° C. and the pressure in the reactor was set to be 15 kPa. A TMG bubbling gas was further introduced into the reactor, to react $NH_3$ with TMA and TMG, so that an $Al_{0.1}Ga_{0.9}N$ layer serving as the first base layer 2b was formed so as to have an average film thickness of about 40 nm.

Subsequent to the formation of the second base layer 2b, in the examples, the superlattice layer group 5 including a plurality of superlattice layers and the termination layer 4 was formed. Except for the example 4, three superlattice layers 3, namely, the first superlattice layer 3a, the second superlattice layer 3b, and the third superlattice layer 3c, were formed. In the example 4, only two superlattice layers 3, namely, the first superlattice layer 3a and the second superlattice layer 3b, were formed. In the comparative example, one superlattice layer 8 was formed. In any of the cases, the first unit layer was entirely made of AlN, and the second unit layer was entirely made of $Al_{0.1}Ga_{0.9}N$. The film thicknesses of the first unit layer and the second unit layer, and the number of repetitions of the pair layers in each of the examples and the comparative example were as shown in FIG. 5. In FIG. 5, for convenience of illustration, the superlattice layer 8 in the comparative example is shown as the first superlattice layer. In the formation of the superlattice layer, the substrate temperature was set to be 1100° C., and the pressure in the reactor was set to be 15 kPa. A used material gas was the same as that used in the formation of the base layer 2.

After the formation of the superlattice layer group 5 or the superlattice layer 8, the intermediate layer 6 and the function layer 7 were formed. The composition of the intermediate layer 6 in each of the examples and the comparative example was as shown in FIG. 5. In any of the cases, the thickness of the intermediate layer 6 was 180 nm. In any of the cases, the function layer 7 was made of GaN and formed with a thickness of 0.7 μm. In the formation of the intermediate layer 6, the substrate temperature was set to be 1100° C., and the pressure in the reactor was set to be 15 kPa. In the formation of the function layer 7, the substrate temperature was set to be 1100° C., and the pressure in the reactor was set to be 15 kPa. In any of the cases, a used material gas was the same as that used in the formation of the base layer 2.

Through the above-described process, an epitaxial substrate was obtained. For the obtained epitaxial substrate, the amount of warping was measured using a laser displacement gauge. Additionally, the presence or absence of occurrence of cracking was checked.

As shown in FIG. 5, in the examples, the warping was reduced to about one half as compared with the comparative example, even though the total film thicknesses of the epitaxial films formed on the base substrates 1 were similar to one another. Besides, only in the epitaxial substrate of the comparative example, cracking occurred at about 20 mm from the outer periphery thereof.

The above-described results indicate that providing the superlattice layer group in such a manner that the thickness of the second unit layer increases in the superlattice layer located at an upper position to thereby cause a greater compressive strain in the superlattice layer located at an upper position is effective in reducing the warping and achieving the crack-free state in the epitaxial substrate.

The invention claimed is:
1. An epitaxial substrate in which a group of group-III nitride layers are formed on a base substrate made of (111)-oriented single crystal silicon such that a (0001) crystal plane of said group of group-III nitride layers is in parallel with the (111) plane of said base substrate, said epitaxial substrate comprising:
 a superlattice layer group in which three superlattice layers are laminated, each of the superlattice layers being formed of a first unit layer and a second unit layer made of group-III nitrides having different compositions being alternately and repeatedly laminated; and
 a crystal layer made of a group-III nitride and formed above said superlattice layer group,
  wherein
  each said first unit layer is made of AlN, and each said second unit layer is made of a group-III nitride having a composition of $Al_xGa_{1-x}N$ ($0 \leq x \leq 0.25$), the composition of the second unit layer is the same for all of the second unit layers, the group-III nitride having the composition of $Al_xGa_{1-x}N$ of each of said second unit layers has an in-plane lattice constant, under a strain-free state, greater than an in-plane lattice constant of the AlN of each of said first unit layers, each of said second unit layers is formed so as to be in a coherent state relative to said first unit layer located immediately below, in said superlattice layer group, the uppermost superlattice layer has an increased thickness of said second unit layer compared to the thickness of the second unit layer of the directly preceding superlattice layer, the thickness of each of the first unit layers is 3 nm-20 nm, the thickness of the second unit layer is 10 nm-20 nm in the lowermost superlattice layer, and the thickness of the second unit layer is several tens nm to 100 nm in the uppermost superlattice layer.

2. The epitaxial substrate according to claim 1, further comprising:

an intermediate layer made of a group-III nitride and formed immediately on said superlattice layer group, said intermediate layer being formed so as to be in a coherent state relative to said superlattice layer group, wherein said intermediate layer is made of a group-III nitride having a composition of $Al_yGa_{1-y}N$ ($0 \leq y \leq 0.25$), and formed with a thickness of 50 nm or more and 250 nm or less.

3. The epitaxial substrate according to claim 1, further comprising:

a first base layer made of AlN and formed on said base substrate; and a second base layer made of $Al_pGa_{1-p}N$ ($0 \leq p \leq 1$) and formed on said first base layer, wherein said first base layer is a layer with many crystal defects configured of at least one kind from a columnar or granular crystal or domain, an interface between said first base layer and said second base layer defines a three-dimensional concavo-convex surface, said superlattice layer group is formed immediately on said second base layer.

4. A method for manufacturing an epitaxial substrate for use in a semiconductor device, said epitaxial substrate having a group of group-III nitride layers formed on a base substrate made of (111)-oriented single crystal silicon such that a (0001) crystal plane of said group of group-III nitride layers is in parallel with the (111) plane of said base substrate, said method comprising:

performing a superlattice layer group formation step three times to form a superlattice layer group in which the superlattice layers are laminated, each said superlattice layer formation step being a step for forming a superlattice layer by alternately and repeatedly laminating a first unit layer and a second unit layer made of group-III nitrides having different compositions; and a crystal layer formation step for forming a crystal layer made of a group-III nitride at a position above said superlattice layer group, wherein in said superlattice layer group formation step, said first unit layer and said second unit layer are formed in such a manner that:

each said first unit layer is made of AlN, and each said second unit layer is made of a group-III nitride having a composition of $Al_xGa_{1-x}N$ ($0 \leq x \leq 0.25$), the composition of the second unit layer is the same for all of the second unit layers, the group-III nitride having the composition of $Al_xGa_{1-x}N$ of each of said second unit layers has an in-plane lattice constant, under a strain-free state, greater than an in-plane lattice constant of the AlN of each of said first unit layers;

each of said second unit layers is in a coherent state relative to said first unit layer located immediately below;

in said superlattice layer group, the uppermost superlattice layer has an increased thickness of said second unit layer compared to the thickness of the second unit layer of the directly preceding superlattice layer, and the thickness of each of the first unit layers is 3 nm-20 nm, the thickness of the second unit layer is 10 nm-20 nm in the lowermost superlattice layer, and the thickness of the second unit layer is several tens nm to 100 nm in the uppermost superlattice layer.

5. The method for manufacturing the epitaxial substrate according to claim 4, further comprising:

an intermediate layer formation step for forming an intermediate layer so as to be in a coherent state relative to said superlattice layer group, said intermediate layer being made of a group-III nitride and formed immediately on said superlattice layer group, wherein said intermediate layer is made of a group-III nitride having a composition of $Al_yGa_{1-y}N$ ($0 \leq y \leq 0.25$), and formed with a thickness of 50 nm or more and 250 nm or less.

6. The method for manufacturing the epitaxial substrate according to claim 4, further comprising:

a first base layer formation step for forming a first base layer on said base substrate, said first base layer being made of AlN; and a second base layer formation step for forming a second base layer on said first base layer, said second base layer being made of $Al_pGa_{1-p}N$ ($0 \leq p \leq 1$), wherein in said first base layer formation step, said first base layer is formed as a layer with many crystal defects configured of at least one kind from a columnar or granular crystal or domain, such that a surface thereof is a three-dimensional concavo-convex surface, in said superlattice layer group formation step, said superlattice layer group is formed immediately on said second base layer.

* * * * *